(12) United States Patent
Du

(10) Patent No.: US 11,411,196 B2
(45) Date of Patent: Aug. 9, 2022

(54) ORGANIC LIGHT-EMITTING DIODE DEVICE AND MANUFACTURING METHOD THEREOF

(71) Applicant: Shenzhen CHINA STAR OPTOELECTRONICS SEMICONDUCTOR DISPLAY TECHNOLOGY CO., LTD., Guangdong (CN)

(72) Inventor: Zhonghui Du, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 324 days.

(21) Appl. No.: 16/623,165

(22) PCT Filed: Nov. 8, 2019

(86) PCT No.: PCT/CN2019/116547
§ 371 (c)(1),
(2) Date: Dec. 16, 2019

(87) PCT Pub. No.: WO2021/082050
PCT Pub. Date: May 6, 2021

(65) Prior Publication Data
US 2021/0359250 A1    Nov. 18, 2021

(30) Foreign Application Priority Data

Oct. 30, 2019 (CN) .......................... 201911045138.2

(51) Int. Cl.
*H01L 51/00* (2006.01)
*H01L 51/52* (2006.01)
(Continued)

(52) U.S. Cl.
CPC ...... *H01L 51/5228* (2013.01); *H01L 27/3244* (2013.01); *H01L 51/0021* (2013.01);
(Continued)

(58) Field of Classification Search
CPC ............. H01L 27/3244; H01L 51/5228; H01L 51/0021; H01L 227/323; H01L 2251/556
See application file for complete search history.

(56) References Cited

U.S. PATENT DOCUMENTS

| | | | |
|---|---|---|---|
| 2007/0132368 A1* | 6/2007 | Kuwahara | H01L 51/0021 313/506 |
| 2020/0083489 A1* | 3/2020 | Fang | H01L 21/77 |
| 2020/0168834 A1 | 5/2020 | Bing et al. | |

FOREIGN PATENT DOCUMENTS

| | | | | |
|---|---|---|---|---|
| CN | 107731883 A | * | 2/2018 | ............. H01L 21/77 |
| CN | 108417726 A | | 8/2018 | |

(Continued)

*Primary Examiner* — Samuel A Gebremariam

(57) ABSTRACT

The disclosure provides an OLED device and a manufacturing method thereof to improve structures of conventional OLED devices. Auxiliary cathodes are manufactured on spacers instead of a cathode layer. As a result, widths of the auxiliary cathodes may be precisely controlled, IR drop can be reduced, and quality of the OLED device can be prevented from being affected because of an overly wide auxiliary cathode.

7 Claims, 9 Drawing Sheets

(51) Int. Cl.
*H01L 27/32* (2006.01)
*H01L 51/56* (2006.01)

(52) U.S. Cl.
CPC ........ *H01L 51/56* (2013.01); *H01L 2227/323* (2013.01); *H01L 2251/301* (2013.01); *H01L 2251/556* (2013.01)

(56) References Cited

FOREIGN PATENT DOCUMENTS

| | | |
|---|---|---|
| CN | 109817669 A | 5/2019 |
| CN | 110176478 A | 8/2019 |

* cited by examiner

ORGANIC LIGHT-EMITTING DIODE DEVICE AND MANUFACTURING METHOD THEREOF

FIELD

The present disclosure relates to the field of display technology and, more particularly, relates to an organic light-emitting diode device and a manufacturing method thereof.

BACKGROUND

Organic light-emitting diode (OLED) devices have advantages such as self-luminescence, full solid-state, and high contrast and have become the most promising novel display device in recent years.

In top-emitting OLED devices, anodes are typically made of thin transparent metals to realize a connection to circuits at a periphery of a screen. However, when a screen size is large, long-distance transport of currents will increase voltage division of an anode because of a long distance between a middle portion of the screen and an electrode port. Therefore, the number of charge carriers injected into the periphery of the screen and the number of charge carriers injected into OLED components in the middle portion of the screen are different, which is called "IR drop", not only resulting in a blank screen in the middle portion of the screen, but also leading to increased power consumption.

Regarding technical problems: to solve the IR drop problem, a conventional method is forming an auxiliary cathode on a cathode of top-emitting OLEDs. However, a material of a cathode of current top-emitting OLEDs is mainly Mg and Ag which make an auxiliary cathode deposited on the cathode have great spreadability and become too wide and too high, which cannot satisfy usage requirements.

SUMMARY

To overcome the shortcomings of conventional technology, the present disclosure provides an OLED device and a manufacturing method thereof, which can adjust width of an auxiliary cathode, reduce sheet resistance of the auxiliary cathode, and solve the IR drop problem.

To solve the above problems, the present disclosure provides an OLED device, including a substrate; a thin film transistor (TFT) circuit layer; a plurality of spacers, wherein the spacers are spaced from each other and are disposed on the TFT circuit layer; a plurality of auxiliary cathode layers, wherein the auxiliary cathode layers are disposed on the spacers; a plurality of anode layers, wherein the anode layers are disposed on the TFT circuit layer and are disposed between the spacers; a plurality of organic light-emitting device layers, wherein the organic light-emitting device layers are disposed on the anode layers and are disposed between the spacers; an electron transport layer, wherein the electron transport layer is disposed on the auxiliary cathode layers and the organic light-emitting device layers and covers the auxiliary cathode layers, the organic light-emitting device layers, and the spacers; and a cathode layer, wherein the cathode layer is disposed on the electron transport layer and covers the electron transport layer.

The auxiliary cathode layers are a plurality of nanosilver lines which are made of nanosilver.

Widths of the nanosilver lines are less than or equal to 35 μm.

The widths of the nanosilver lines are 30 μm.

Materials of the anode layers include indium tin oxide (ITO).

A material of the anode layer includes Mg and Ag.

Materials of the spacers include hydrophobic resin.

The organic light-emitting device layers include a hole injection layer, a hole transport layer, and an organic light-emitting layer.

To solve the above problems, the present disclosure further provides a method of manufacturing an OLED device, including the following steps: step 1: providing a substrate, forming a thin film transistor (TFT) circuit layer on the substrate, and forming a plurality of spacers on the TFT circuit layer, wherein the spacers are spaced from each other; step 2: forming a plurality of auxiliary cathode layers on the spacers; step 3: forming a plurality of anode layers on the TFT circuit layer and between the spacers, and forming a plurality of organic light-emitting device layers on the anode layers and between the spacers; step 4, forming an electron transport layer on the auxiliary cathode layers and the organic light-emitting device layers, wherein the electron transport layer covers the auxiliary cathode layers, the organic light-emitting device layers, and the spacers; and step 5: forming a cathode layer on the electron transport layer, wherein the cathode layer covers the electron transport layer.

The auxiliary cathode layers are a plurality of nanosilver lines which are made of nanosilver.

Widths of the nanosilver lines are less than or equal to 35 μm.

The widths of the nanosilver lines are 30 μm.

Materials of the anode layers include indium tin oxide (ITO).

A material of the anode layer includes Mg and Ag.

The step of forming the plurality of auxiliary cathode layers includes: dropping the nanosilver at a certain distance ranging from 25 μm to 35 μm from each on the spacers and heating the nanosilver at 90 Celsius degrees to 150 Celsius degrees for 30 minutes to 60 minutes to form the nanosilver lines.

Materials of the spacers include hydrophobic resin.

The organic light-emitting device layers include a hole injection layer, a hole transport layer, and an organic light-emitting layer.

Regarding beneficial effects: the present disclosure provides an OLED device and a manufacturing method thereof. By improving structures of conventional OLED devices, IR drop can be reduced, and quality of the OLED device can be prevented from being affected because of an overly wide auxiliary cathode.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
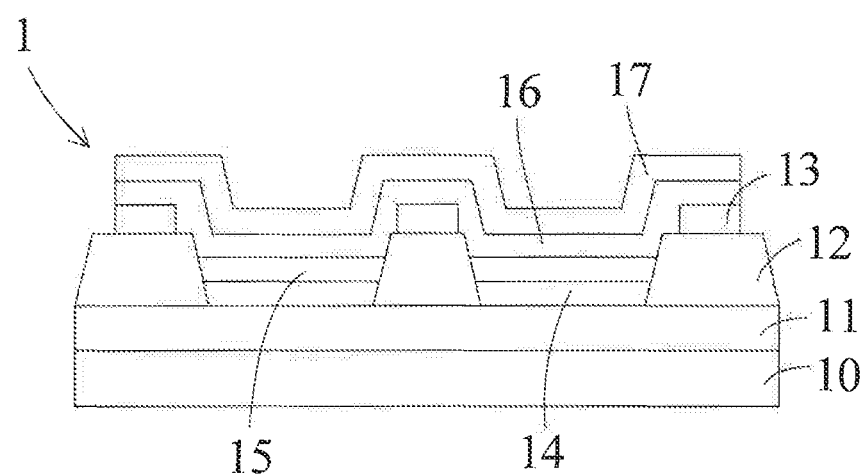
FIG. 1 is a schematic structural view showing an OLED device provided by an embodiment of the present disclosure.

The following description of the various embodiments is provided with reference to the accompanying drawings. It should be understood that terms such as "upper", "lower", "front", "rear", "left", "right", "inside", "outside", "lateral", as well as derivative thereof should be construed to refer to the orientation as then described or as shown in the drawings under discussion. Thus, features limited by "first" and "second" are intended to indicate or imply including one or more than one these features. In the drawings, the identical or similar reference numerals constantly denote the identical or similar elements or elements having the identical or similar functions.

Examples of the described embodiments are given in the accompanying drawings, and the specific embodiments described with reference to the accompanying drawings are all exemplary and are intended to interpret the practical application of the present disclosure, which shall not be construed as causing limitations to the present disclosure. Therefore, those skilled in the art can understand the described embodiments and modifications to the described embodiments.

As shown in FIG. 1, the present disclosure provides an OLED device 1, including a substrate 10; a thin film transistor (TFT) circuit layer 11, wherein the TFT circuit layer 11 is disposed on the substrate 10; a plurality of spacers 12, wherein the spacers 12 are spaced from each other and are disposed on the TFT circuit layer 11; a plurality of auxiliary cathode layers 13, wherein the auxiliary cathode layers 13 are disposed on the spacers 12; a plurality of anode layers 14, wherein the anode layers 14 are disposed on the TFT circuit layer 11 and are disposed between the spacers 12; a plurality of organic light-emitting device layers 15, wherein the organic light-emitting device layers 15 are disposed on the anode layers 14 and are disposed between the spacers 12; an electron transport layer 16, wherein the electron transport layer 16 is disposed on the auxiliary cathode layers 14 and the organic light-emitting device layers 15 and covers the auxiliary cathode layers 13, the organic light-emitting device layers 15, and the spacers 12; and a cathode layer 17, wherein the cathode layer 17 is disposed on the electron transport layer 16 and covers the electron transport layer 16.

In the present embodiment, materials of the anode layers 14 are indium tin oxide, the auxiliary cathode layers 13 are a plurality of nanosilver lines which are made of nanosilver, and the spacers 12 are made of hydrophobic resin. Rather than being manufactured on the cathode layer 17, the auxiliary cathode layers 13 are manufactured on the spacers 12. Therefore, spreadabilities of the auxiliary cathode layers 13 are reduced, which may ensure that widths of the nanosilver lines are less than or equal to 35 μm (in the present embodiment, the widths of the nanosilver lines are 30 μm), thereby achieving purposes of reducing IR drop and controlling the widths of nanosilver lines.

In the present embodiment, a material of the cathode layer 17 includes Mg and Ag, but is not limited thereto. Problems of IR drop and overly wide nanosilver lines may also occur when the nanosilver lines are manufactured on a cathode layer made of other materials, and the above situation is prevented by the present disclosure by improving a structure of conventional OLEDs.

Figure 2:
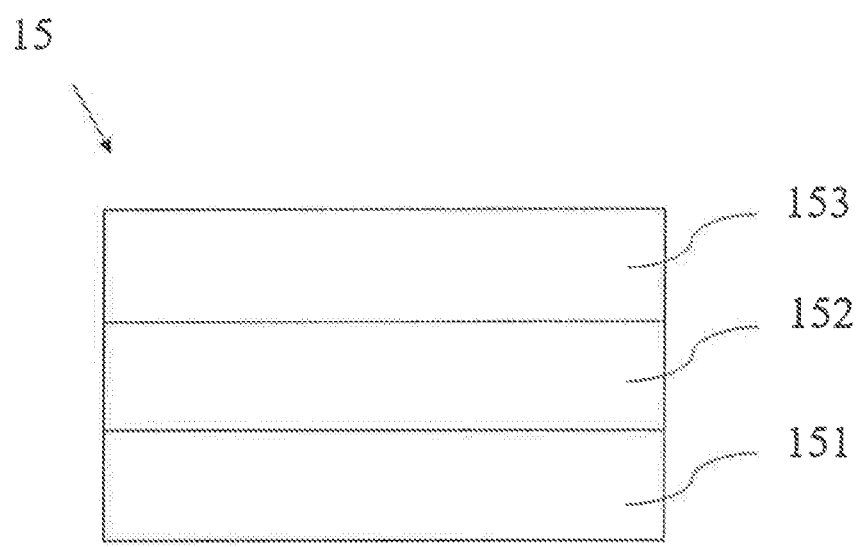
FIG. 2 is a schematic structural view showing an organic light-emitting layer of an OLED device provided by the embodiment of the present disclosure.
Figure 3:
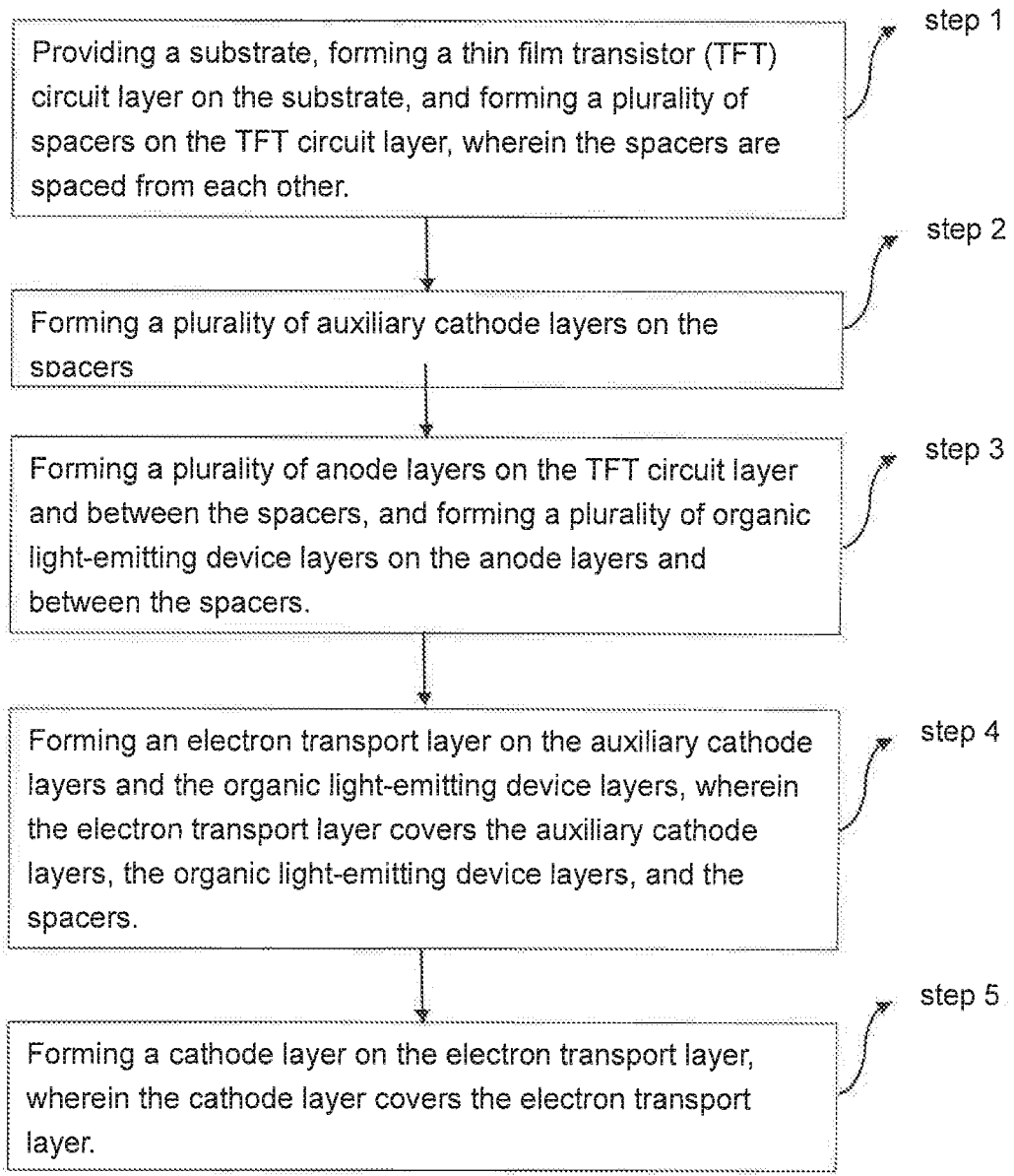
FIG. 3 is a flowchart showing a manufacturing method of an OLED device provided by the embodiment of the present disclosure.
Figure 4:
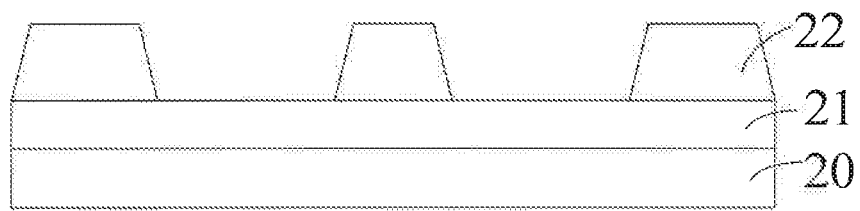
FIG. 4 is a schematic structural view showing the OLED device manufactured by the manufacturing method provided by the embodiment of the present disclosure after step 1.
Figure 5:
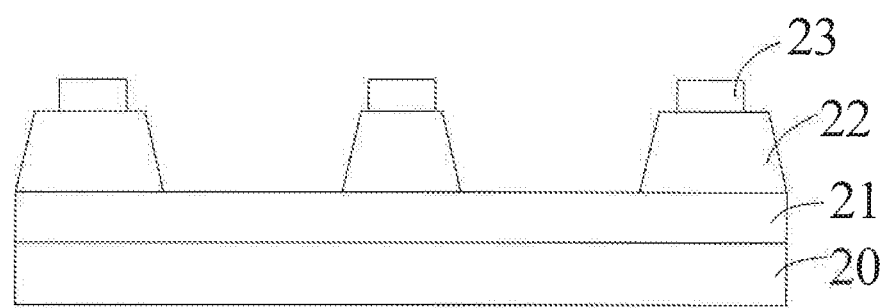
FIG. 5 is a schematic structural view showing the OLED device manufactured by the manufacturing method provided by the embodiment of the present disclosure after step 2.
Figure 6:
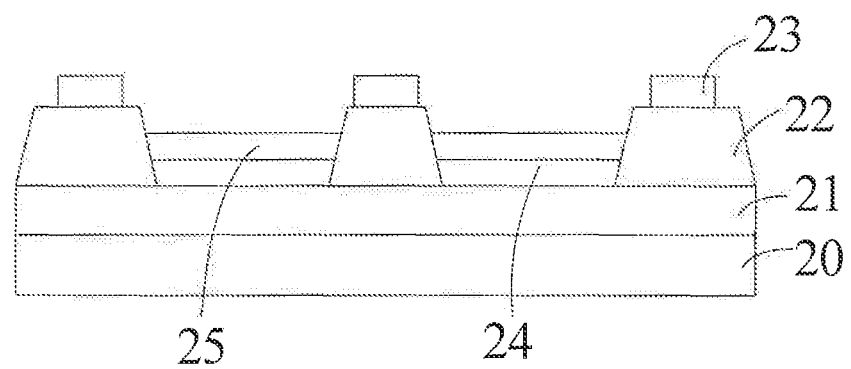
FIG. 6 is a schematic structural view showing the OLED device manufactured by the manufacturing method provided by the embodiment of the present disclosure after step 3.
Figure 7:
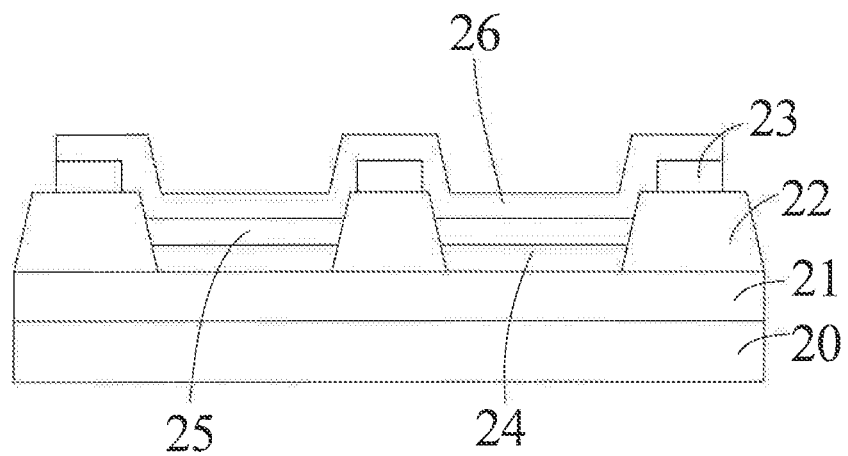
FIG. 7 is a schematic structural view showing the OLED device manufactured by the manufacturing method provided by the embodiment of the present disclosure after step 4.
Figure 8:
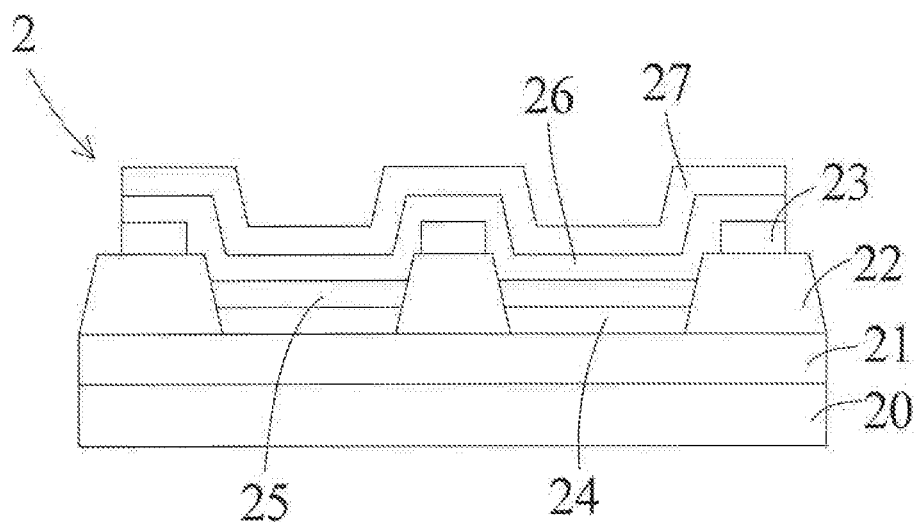
FIG. 8 is a schematic structural view showing the OLED device manufactured by the manufacturing method provided by the embodiment of the present disclosure after step 5.

In the present embodiment, as shown in FIG. 2, each of the OLED device layers 15 further includes a hole injection layer 151, a hole transport layer 152, and an organic light-emitting layer 153.

As in FIG. 3 to FIG. 8, another embodiment of the present disclosure provides a method of manufacturing an OLED device 2, including the following steps: step 1: providing a substrate 20, forming a thin film transistor (TFT) circuit layer 21 on the substrate 20, and forming a plurality of spacers 22 on the TFT circuit layer 21, wherein the spacers 22 are spaced from each other; step 2: forming a plurality of auxiliary cathode layers 23 on the spacers 22; step 3: forming a plurality of anode layers 24 on the TFT circuit layer 21 and between the spacers 22, and forming a plurality of organic light-emitting device layers 25 on the anode layers 24 and between the spacers 22; step 4, forming an electron transport layer 26 on the auxiliary cathode layers 23 and the organic light-emitting device layers 25, wherein the electron transport layer 26 covers the auxiliary cathode layers 23, the organic light-emitting device layers 25, and the spacers 22; and step 5: forming a cathode layer 27 on the electron transport layer 26, wherein the cathode layer 27 covers the electron transport layer 26.

In the present embodiment, materials of the anode layers 24 are indium tin oxide, the auxiliary cathode layers 23 are a plurality of nanosilver lines which are made of nanosilver, and the spacers 22 are made of hydrophobic resin. Rather than being manufactured on the cathode layer 27, the auxiliary cathode layers 23 are manufactured on the spacers 22. Therefore, spreadabilities of the auxiliary cathode layers 23 are reduced, which may ensure that widths of the nanosilver lines are less than 35 μm (in the present embodiment, the widths of the nanosilver lines are 30 μm), thereby achieving purposes of reducing IR drop and controlling the widths of nanosilver lines.

Furthermore, the step of forming the plurality of auxiliary cathode layers 23 includes: dropping the nanosilver at a certain distance ranging from 25 μm to 35 μm on the spacers 22 and heating the nanosilver at a temperature of from 90° C. to 150° C. for 30 minutes to 60 minutes to form the nanosilver lines.

To achieve the best effect of film formation, when the nanosilver lines are manufactured, the certain distance is preferably 30 μm.

In the present embodiment, the nanosilver lines are manufactured on the cathode layer 27 made of Mg and Ag in a ratio of 1:9 and on the spacers 22 respectively, and contact angles and the widths of nanosilver lines thereof are tested, which are shown in Table 1.

TABLE 1

| base | contact angles between the nanosilver lines and the base (°) | the widths of the nanosilver lines on the base (μm) |
|---|---|---|
| spacers 22 | 53.4 | 30 |
| cathode layer 27 | 30.5 | 66 to 76 |

According to Table 1, contact angles between the nanosilver lines and the spacers 22 are greater than contacts angles between the nanosilver lines and the cathode layer 27 under a situation that the predetermined distance is 30 μm, resulting from the spacers 22 made of hydrophobic resin which make the spreadibilities of the nanosilver lines deposited on the spacers 22 less than the spreadibilites of the nanosilver lines deposited on the cathode layer 27. Therefore, the widths of the nanosilver lines may be controlled to about 30 μm, thereby achieving purposes of reducing IR drop and controlling the widths of nanosilver lines.

In the present embodiment, a material of the cathode layer 27 includes Mg and Ag, but is not limited thereto. Problems of IR drop and overly wide nanosilver lines may occur when the nanosilver lines are manufactured on a cathode layer made of other materials, and the above situation is prevented by the present disclosure by improving a structure of conventional OLEDs.

Figure 9:
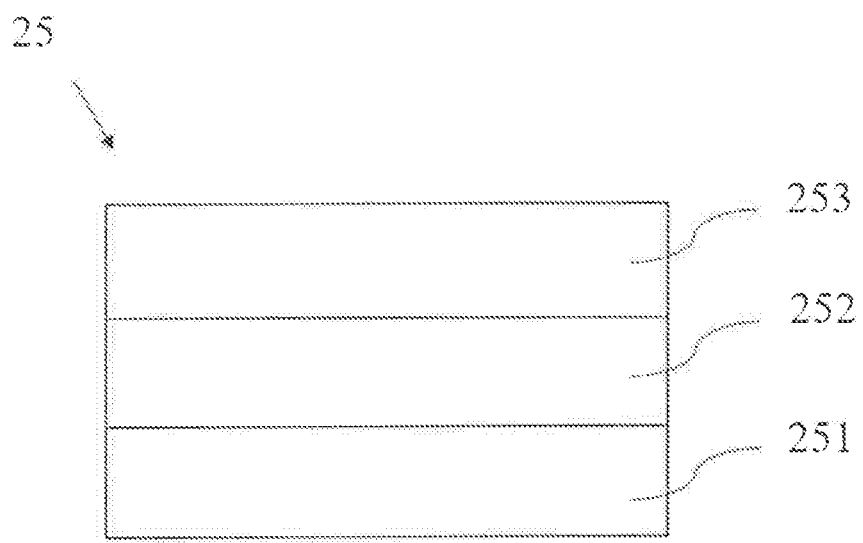
FIG. 9 is a schematic structural view showing the OLED device manufactured by the manufacturing method provided by the embodiment of the present disclosure.

In the present embodiment, as shown in FIG. 9, each of the OLED device layers 25 further includes a hole injection layer 251, a hole transport layer 252, and an organic light-emitting layer 253.

The present disclosure has been described with preferred embodiments thereof. The preferred embodiments are not intended to limit the present disclosure, and it is understood that many changes and modifications to the described embodiment can be carried out without departing from the scope and the spirit of the disclosure that is intended to be limited only by the appended claims.

What is claimed is:

1. An organic light-emitting diode (OLED) device, comprising:
   a substrate;
   a thin film transistor (TFT) circuit layer;
   a plurality of spacers, wherein the spacers are spaced from each other and are disposed on the TFT circuit layer;
   a plurality of auxiliary cathode layers, wherein the auxiliary cathode layers are disposed on the spacers;
   a plurality of anode layers, wherein the anode layers are disposed on the TFT circuit layer and are disposed between the spacers;
   a plurality of organic light-emitting device layers, wherein the organic light-emitting device layers are disposed on the anode layers and are disposed between the spacers;
   an electron transport layer, wherein the electron transport layer is disposed on the auxiliary cathode layers and the organic light-emitting device layers and covers the auxiliary cathode layers, the organic light-emitting device layers, and the spacers; and
   a cathode layer, wherein the cathode layer is disposed on the electron transport layer and covers the electron transport layer;
   wherein the auxiliary cathode layers are not disposed on the cathode layer, and material of the spacers comprises hydrophobic resin.

2. The OLED device of claim 1, wherein the auxiliary cathode layers are a plurality of nanosilver lines which are made of nanosilver.

3. The OLED device of claim 2, wherein widths of the nanosilver lines are less than or equal to 35 μm.

4. The OLED device of claim 3, wherein the widths of the nanosilver lines are 30 μm.

5. The OLED device of claim 1, wherein materials of the anode layers comprise indium tin oxide (ITO).

6. The OLED device of claim 1, wherein a material of the cathode layer comprises Mg and Ag.

7. The OLED device of claim 1, wherein the organic light-emitting device layers comprise a hole injection layer, a hole transport layer, and an organic light-emitting layer.

* * * * *